(12) United States Patent
Yamazaki et al.

(10) Patent No.: US 7,598,927 B2
(45) Date of Patent: Oct. 6, 2009

(54) LIGHT-EMITTING DEVICE, DRIVING SUPPORT SYSTEM, AND HELMET

(75) Inventors: Shunpei Yamazaki, Tokyo (JP); Jun Koyama, Kanagawa (JP); Hideaki Kuwabara, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 578 days.

(21) Appl. No.: 10/918,402

(22) Filed: Aug. 16, 2004

(65) Prior Publication Data

US 2005/0052348 A1 Mar. 10, 2005

(30) Foreign Application Priority Data

Aug. 22, 2003 (JP) ............................. 2003-299126

(51) Int. Cl.
*G05D 1/00* (2006.01)
*G06G 7/78* (2006.01)
(52) U.S. Cl. .................... 345/7; 345/4; 701/1; 701/301
(58) Field of Classification Search ................ 345/4–9, 345/1.1, 3.1, 30–100; 701/1, 9, 28, 29, 36, 701/200, 300, 301
See application file for complete search history.

(56) References Cited

U.S. PATENT DOCUMENTS

| 5,061,569 | A | | 10/1991 | Vanslyke et al. | |
| 5,200,844 | A | | 4/1993 | Suvada | |
| 5,396,430 | A | | 3/1995 | Arakawa et al. | |
| 5,414,461 | A | * | 5/1995 | Kishi et al. ..................... | 345/7 |
| 5,432,509 | A | * | 7/1995 | Kajiwara ..................... | 340/903 |
| 5,570,698 | A | * | 11/1996 | Liang et al. .................. | 600/558 |
| 5,648,857 | A | | 7/1997 | Ando et al. | |
| 5,757,949 | A | * | 5/1998 | Kinoshita et al. .............. | 701/1 |
| 5,800,265 | A | | 9/1998 | Yamazaki et al. | |
| 5,821,138 | A | | 10/1998 | Yamazaki et al. | |
| 5,822,126 | A | | 10/1998 | Cursolle et al. | |
| 5,920,256 | A | * | 7/1999 | Toffolo et al. ............... | 340/461 |

(Continued)

FOREIGN PATENT DOCUMENTS

EP 0 783 843 7/1997

(Continued)

OTHER PUBLICATIONS

H. Takada et al., "Aligning Layers Using AZO Dye Derivatives for Liquid Crystal Devices," SID '03 Digest, SID International Symposium Digest of Technical Papers, pp. 620-623, 2003.

(Continued)

*Primary Examiner*—David L Lewis
(74) *Attorney, Agent, or Firm*—Fish & Richardson P.C.

(57) ABSTRACT

It is an object to provide a driving support system and a display device suitable for the driving support system. According to the driving support system, change in driver's mental and physical conditions can be caught instantaneously and a warning light emission display is given within the forward sight of the driver in order to call the driver's attention. A light emitting device of the driving support system can display a far side of the display. A display may be switched between a transmission mode and a non-transmission mode by adjusting a movable polarizer.

16 Claims, 8 Drawing Sheets

U.S. PATENT DOCUMENTS

| | | | |
|---|---|---|---|
| 6,181,394 B1 | 1/2001 | Sanelle et al. | |
| 6,206,610 B1 | 3/2001 | Neuling | |
| 6,311,123 B1 * | 10/2001 | Nakamura et al. | 701/96 |
| 6,359,737 B1 | 3/2002 | Stringfellow | |
| 6,376,333 B1 | 4/2002 | Yamazaki et al. | |
| 6,483,484 B1 | 11/2002 | Yamazaki et al. | |
| 6,538,622 B1 | 3/2003 | Kojima et al. | |
| 6,573,952 B1 | 6/2003 | Yamazaki et al. | |
| 6,611,384 B1 * | 8/2003 | Biverot | 345/7 |
| 6,679,702 B1 * | 1/2004 | Rau | 701/301 |
| 6,731,435 B1 | 5/2004 | Kormos et al. | |
| 6,801,185 B2 | 10/2004 | Salley | |
| 6,847,873 B1 * | 1/2005 | Li | 701/36 |
| 6,919,866 B2 * | 7/2005 | Kanevsky et al. | 345/8 |
| 6,933,991 B2 | 8/2005 | Sanelle et al. | |
| 6,950,035 B2 * | 9/2005 | Tanaka et al. | 701/300 |
| 6,977,630 B1 | 12/2005 | Donath et al. | |
| 6,998,282 B1 | 2/2006 | Yamazaki et al. | |
| 7,054,723 B2 * | 5/2006 | Seto et al. | 701/1 |
| 7,141,817 B2 | 11/2006 | Nishi et al. | |
| 7,151,515 B2 | 12/2006 | Kim et al. | |
| 7,161,185 B2 | 1/2007 | Yamazaki et al. | |
| 7,259,809 B2 | 8/2007 | Brandt et al. | |
| 7,361,519 B2 * | 4/2008 | Yamazaki et al. | 438/26 |
| 7,366,595 B1 * | 4/2008 | Shimizu et al. | 701/301 |
| 7,372,076 B2 | 5/2008 | Nishi et al. | |
| 2001/0020922 A1 | 9/2001 | Yamazaki et al. | |
| 2002/0027833 A1 | 3/2002 | Basturk | |
| 2002/0033919 A1 | 3/2002 | Sanelle et al. | |
| 2002/0118282 A1 * | 8/2002 | Nakamura | 348/148 |
| 2002/0167511 A1 | 11/2002 | Kim et al. | |
| 2003/0080933 A1 * | 5/2003 | Kondoh | 345/96 |
| 2003/0169491 A1 | 9/2003 | Bender et al. | |
| 2004/0066376 A1 | 4/2004 | Donath et al. | |
| 2004/0075786 A1 | 4/2004 | Brandt et al. | |
| 2004/0085198 A1 * | 5/2004 | Saito et al. | 701/29 |
| 2004/0150515 A1 | 8/2004 | Kallhammer et al. | |
| 2004/0193347 A1 * | 9/2004 | Harumoto et al. | 701/45 |
| 2004/0201545 A1 | 10/2004 | Yamazaki et al. | |
| 2004/0226200 A1 | 11/2004 | Salley | |
| 2004/0227083 A1 | 11/2004 | Kallhammer et al. | |
| 2004/0227159 A1 | 11/2004 | Nakashima et al. | |
| 2004/0227698 A1 | 11/2004 | Yamazaki et al. | |
| 2004/0245529 A1 | 12/2004 | Yamazaki et al. | |
| 2004/0245531 A1 | 12/2004 | Fuii et al. | |
| 2004/0263066 A1 * | 12/2004 | Abe et al. | 313/504 |
| 2005/0024293 A1 | 2/2005 | Sakata et al. | |
| 2005/0024339 A1 | 2/2005 | Yamazaki et al. | |
| 2005/0162421 A1 | 7/2005 | Yamazaki et al. | |
| 2005/0162578 A1 | 7/2005 | Yamazaki et al. | |
| 2006/0001800 A1 | 1/2006 | Sanelle et al. | |
| 2006/0274018 A1 | 12/2006 | Kim et al. | |
| 2008/0007675 A1 | 1/2008 | Sanelle et al. | |
| 2008/0049106 A1 | 2/2008 | Kallhammer et al. | |

FOREIGN PATENT DOCUMENTS

| | | | |
|---|---|---|---|
| EP | 1 024 057 | | 8/2000 |
| EP | 1 055 952 | | 11/2000 |
| EP | 1 256 833 | | 11/2002 |
| EP | 1 500 557 | | 1/2005 |
| EP | 1 619 534 | | 1/2006 |
| GB | 2375645 | * | 11/2002 |
| JP | 60-188641 | | 12/1985 |
| JP | 62-031823 | | 2/1987 |
| JP | 04-198980 | | 7/1992 |
| JP | 05-085446 | | 4/1993 |
| JP | 05-234681 | | 9/1993 |
| JP | 06-088731 | | 3/1994 |
| JP | 06-182056 | | 7/1994 |
| JP | 06-215300 | | 8/1994 |
| JP | 10-201727 | | 8/1998 |
| JP | 2001-249303 | | 9/2001 |
| JP | 2001-272968 | | 10/2001 |
| JP | 3408154 | | 5/2003 |
| JP | 2003-229278 | | 8/2003 |
| WO | WO 00/43832 | | 7/2000 |
| WO | 2001/080204 | | 10/2001 |
| WO | 2002/36389 | | 5/2002 |
| WO | WO 02/052495 | | 7/2002 |
| WO | 2003/016983 | | 2/2003 |

OTHER PUBLICATIONS

Exhibition of Active Matrix Type Organic EL Display at "13th Flat Panel Display Manufacturing Technology Expo & Conference" by ELDis Group (in Japanese with full translation); Jul. 2, 2003, 4 pages.

Documents distributed in the "13$^{th}$ Flat Panel Display Manufacturing Technology Expo & Conference" by ELDis Group, Jul. 2, 2003, 5 pages (partial translation).

"Two-way display developed"; *The Japan Times*; (1 page); Jul. 3, 2003.

"Mass Production of Organic EL Devices"; *Shimotsuke Newspaper* (*in Japanese with full translation*); Jul. 3, 2003.

H. H. Lee, "9.3: 2.2" QCIF Full Color Transparent AMOLED Display, SID'03 Digest, 2003 International Symposium Digest of Technical Papers, vol. XXXIV, Book 1, pp. 104-107, May 20, 2003.

Partial European Search Report for Application No. 04019315.3, dated May 8, 2008.

Search Report (European Patent Application No. 04019315.3) dated Aug. 12, 2008; 7 pages.

* cited by examiner

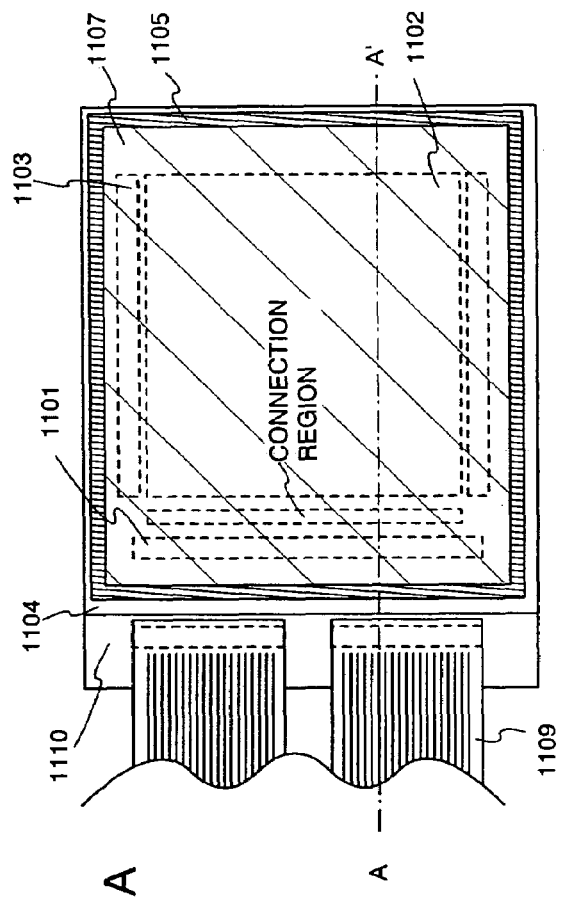
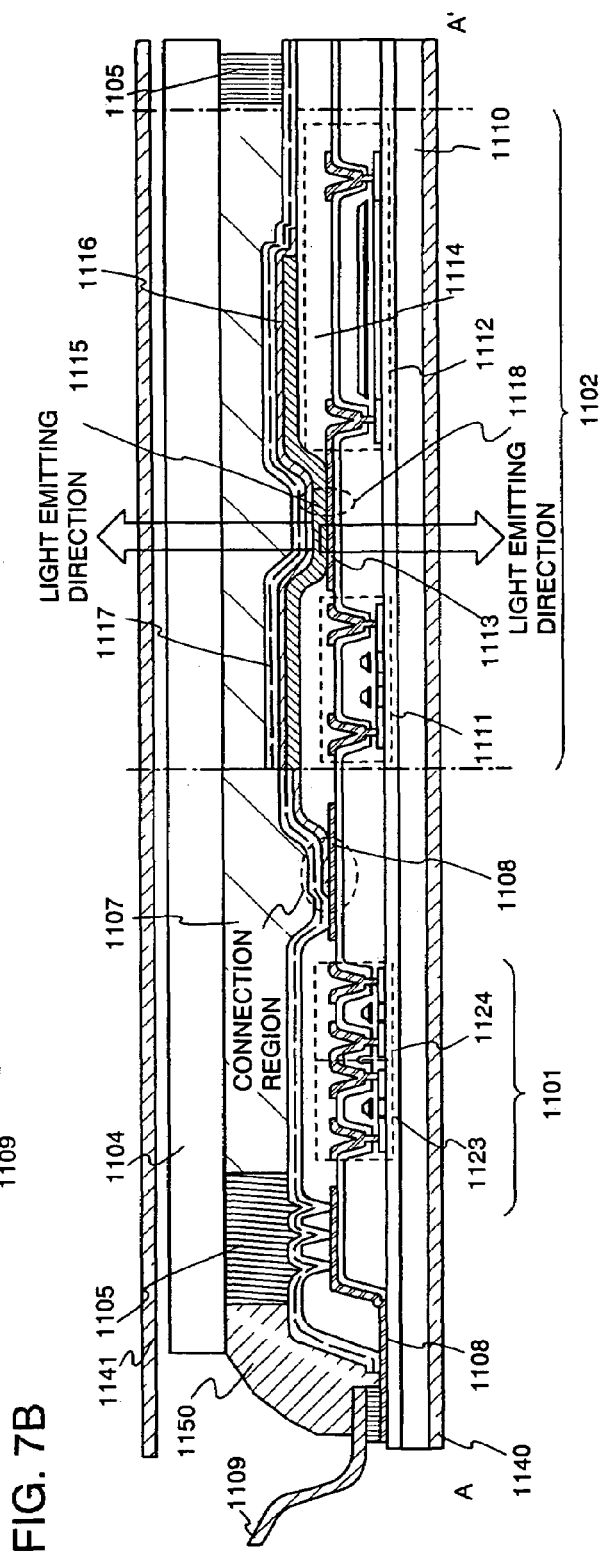
FIG. 7A
FIG. 7B

LIGHT-EMITTING DEVICE, DRIVING SUPPORT SYSTEM, AND HELMET

BACKGROUND OF THE INVENTION

1. Field of the Invention

The present invention relates to a driving support system installed in various mobile objects such as a car and a motorcycle, and in particular, the invention relates to a display device suitable for a driving support system, a helmet provided with a display device, and a driving support system including a display device.

2. Description of the Related Art

In recent years, driving support systems for various mobile objects (car, motorcycle, plane, and the like) have been actively developed aiming for improvement of driving as to safety and comfort. 'Adaptive Cruise Control System' has already been produced by using a driving environment sensing technology, which is a driving support system for controlling the constant speed drive, for controlling car following the preceding vehicle (for controlling a distance between cars).

In addition, for example, disclosed in Patent Document 1 is a technology of detecting surrounding objects such as other vehicles and of giving a warning in the case where any obstruction is detected.

Furthermore, various kinds of car navigation systems have been put into practical use. Patent Document 2 is an example thereof. The route guidance is carried out by the car navigation system in the following manner. The car navigation system stores map data in a memory device thereof in advance and receives a detected signal from driving condition detecting sensors such as a direction sensor, an angular speed sensor, and a distance sensor or receives a location signal such as latitude and longitude data from a satellite by using a GPS. According to either or both of the detected signal and the location signal, the car navigation system measures the present location and reads out the map data from the memory device based on the result of measurement, so that the present location is displayed by a display device thereof.

The display device of the car navigation system is a liquid crystal display device, a display device using a CRT (cathode-ray tube) or the like, or a projection display device.

As the car navigation system is assumed to be installed in a vehicle, it is difficult to install the system in a vehicle having small frontspace around a driver's seat such as a motorcycle and a snowmobile. In addition, in the case where the display device is installed in the vehicle, it cannot be set within the forward sight of the driver. Therefore, the driver can not keep his eyes ahead at the wheel in order to view the display device and it is very dangerous. In view of this, it is proposed that a means for projecting data is provided in a helmet for a driver to project data within a sight of the driver as disclosed in Patent Document 3.

Disclosed in Patent Document 4 is a display system for adjusting luminance in accordance with surrounding circumstance data or living body information of a user of an EL display device.

Disclosed in Patent Document 5 is a game machine that works in accordance with the mental and physical conditions of a player by using a chaos attractor.

Patent Document 1: Japanese Patent Application Laid-Open No. Hei 6-215300
Patent Document 2: Japanese Patent Application Laid-Open No. Hei 6-88731
Patent Document 3: Japanese Patent Application Laid-Open No. Hei 5-85446
Patent Document 4: Japanese Patent Application Laid-Open No. 2001-272968
Patent Document 5: Japanese Patent Application Laid-Open No. Hei 6-182056

Since a display device of a driving support system is either a direct-view display device such as a liquid crystal display device and a display device using a CRT, or a projection display device, the display device is installed in or on a dashboard.

In the case where the direct-view display device is installed in the dashboard, a driver can not keep his eyes ahead at the wheel in order to view the display device and it is very dangerous.

In the case where the direct-view display device is installed on the dashboard, the display device itself blocks part of the forward sight of a driver.

On the other hand, in the case where the projection display device is installed in the dashboard, displayed data is displayed forward at a windshield as a virtual image. Therefore, a visual image superposed the displayed data on a front scene is displayed, so that safe driving is realized. However, it is difficult to design an optical system due to a curve of the windshield. Further, it is extremely difficult to design an optical system for such a precise display as a map. Since the projection display device also requires a strong light source, the power consumption becomes quite large and large load may be applied to a battery of a mobile object. In addition, the projection display device requires a light path for projection, which is difficult to be provided in a limited space inside vehicle even when a mirror and the like are used. The projection display device is also difficult to be viewed by a person in a passenger seat other than a driver due to its narrow viewing angle.

It is preferable that a display device can be installed easily. Since the projection display device is installed in a dashboard, it takes some trouble to repair it when it breaks down. Besides, when the display device is under repair, a car cannot be used even when there is nothing wrong with the car.

SUMMARY OF THE INVENTION

The present invention provides a driving support system and a display device which is best suited for the system.

According to the invention, a light emitting device is fabricated by using an active matrix substrate provided with TFTs, through which a far side of the display device can be seen. The light emitting device according to the invention includes a light emitting element comprising a cathode and an anode that are made of a highly transparent material, and an organic compound layer sandwiched between them. The light emitting device of the invention is thin, lightweight, and consumes low power. Since the light emitting device of the invention is transparent or translucent, a visual image superposed on a front scene can be displayed, so that safe driving is realized even when it is installed on a dashboard.

Because the light emitting device itself is a transparent or translucent, the display may not be seen clearly depending on a background (specifically, a strong sunray, a headlight of a car coming from the opposite direction, and the like). In that case, the light emitting device can switch from a transmission mode to a non-transmission mode. That is, the light emitting device of the invention can freely switch between a display superposed on a front scene and a display shielding the front scene. For example, a first polarizer is provided either on the front surface or the back surface of the light emitting device while a second polarizer, which is removable, is provided on the other side so as to superpose a display portion, so that a clear image without background can be obtained.

Further, the present invention provides a light emitting device mounted on a vehicle and disposed within the forward sight of a driver, which comprises a front polarizer and a back polarizer which cover the front surface and the back surface of the light emitting device respectively, and switches between a display superposed on a front scene and a display shielding the front scene by adjusting the back polarizer disposed between the driver and the light emitting device.

According to the invention, a plurality of light emitting elements is disposed in matrix in the light emitting device and the light emitting element comprises a first electrode which transmits light, an organic compound layer, and a second electrode which transmits light.

In addition, according to the invention, the front polarizer and the back polarizer are disposed so that their polarizing axes are crossed at right angles with each other. Furthermore, according to the above structure, the vehicle includes a passenger car, a truck, a bus, a special purpose car, a special kind car, a specially equipped car, an electric train, and an automatic two-wheeled vehicle.

When giving a warning based on a judging means for judging if there is any vehicle ahead, an obstruction, or living body information of a driver to the driver, the display of the light emitting device is preferably switched from a display superposed on a front scene to a display shielding the front scene in order to make the display impressive.

The living body information of a driver means data such as degree of eye afflux, pulsation, blood pressure, body temperature, opened degree of pupils, brain wave, ocular movement, refracting power of crystal lenses of eyes, and electrocardiogram of the driver. A biosignal detecting means for detecting the living body information of the driver includes a brain wave sensor, a pulse wave sensor, a skin temperature sensor, an eye blink sensor for detecting blinking, and a CCD for shooting a picture of a facial expression, degree of eye afflux, or opened degree of pupils.

However, it is difficult to judge mental and physical conditions of a driver based on data from the above-mentioned sensors only, and thus the invention uses the chaos theory. The chaos means a dynamic phenomenon that becomes random in essence resulting from a complex system, which is derived to have a non-linear shape despite being a system having a deterministic law. The topology that characterizes the system of chaos is called chaos attractor, which is a mathematical structure where the system generating chaos converges. Living body information obtained by the biosignal detecting means is numerically processed to obtain a chaos attractor and then, a lyapunov index indicating to what degree the chaos attractor matches the definition of the chaos so that the mental and physical conditions of the driver are detected to prevent him from falling asleep at the wheel and to check the decrease in his concentration. The invention utilizes the chaos attractor which appears to be complex when a driver is healthy whereas it appears to be simple when the driver has less concentration or mentally or physiologically unstable.

The use of chaos enables to detect the change in mental and physical conditions of a driver quickly and a warning is given to call the driver's attention. In order to prevent a driver from falling asleep at the wheel, for example, a driving support system using chaos that gives a warning when a chaos attractor becomes simple, namely before the driver falls asleep at the wheel is more effectively used than a simple driving support system that gives a warning only after the period with driver's eyes closed from the start of sleeping exceeds a certain period.

In addition, according to the invention, a high resolution display can be realized by using a light emitting device comprising an active matrix substrate on which TFTs are provided.

A driving support system of the invention comprises a means for shooting a picture of a front or a peripheral scene of a vehicle, a judging means for judging if there is any vehicle ahead, a road obstruction, or living body information of a driver, and a display means for displaying data on the drive of a vehicle or warning data based on the judging means, wherein the display means can switch between a display superposed on a front scene in the case of displaying data on the drive of the vehicle and a display shielding the front scene in the case of displaying warning data.

In addition, a driving support system of the invention comprises a means for shooting a picture of a front or a peripheral scene of a vehicle, a judging means for judging if there is any vehicle ahead, a road obstruction, or living body information of a driver, a display means for displaying data on the drive of a vehicle or warning data based on the judging means, and a surrounding circumstance detecting means for detecting a surrounding circumstance of a vehicle, wherein the driving support system of the invention can switch automatically between a display superposed on a front scene and a display shielding the front scene depending on the surrounding circumstance obtained by the surrounding circumstance detecting means.

According to the above-described driving support system, the surrounding circumstance detecting means for detecting a surrounding circumstance of a vehicle is a sensor for detecting the amount of light which comes into the vehicle.

In addition, a driving support system of the invention comprises a means for shooting a picture of a front or a peripheral scene of a vehicle, a judging means for judging if there is any vehicle ahead, a road obstruction, or living body information of a driver, a display means for displaying data on the drive of a vehicle or a warning based on the judging means, and a surrounding circumstance detecting means for detecting a surrounding circumstance of a vehicle, wherein the display means for displaying a warning emits strong light from the whole surface instantaneously to a driver and to the forward sight of the driver.

Each of the above-described driving support systems comprises an audio output means for outputting warning data based on the judging means.

In addition, each of the above-described driving support systems further comprises a location data calculating means for calculating a self-location based on a signal from a GPS receiver, and a memory means for storing map data, whereby map data is read out from the memory means based on the location data calculating means and the map data is outputted by the display means.

In addition, each of the above-described driving support systems is a light emitting device, wherein a front scene can be viewed through a non-emitting part when non-emitting, and the display can be switched to a display shielding the front scene by adjusting a polarizer.

Furthermore, according to each of the above-described driving support systems, the judging means for judging living body information of a driver is a means for judging the driver's mental and physical conditions which comprises a sensor for catching living body information of the driver, a chaos attractor generating portion for calculating a chaos attractor by numerically processed data caught by the sensor, and a lyapunov index generating portion for calculating an index indicating to what degree the chaos attractor matches the definition of the chaos.

In the case of a vehicle having a small frontspace around a driver's seat such as a motorcycle and a snowmobile, a light emitting device is installed in a helmet. The light emitting device for helmet is structured so that a far side of the device can be seen. A light emitting device having an organic compound layer as a light emitting layer can display a high resolution image such as navigation data and is advantageous in its lightweight and compactness compared with the other display devices. A projection display device requires a light path for projection, which is difficult to be provided in a limited space inside a helmet even when a mirror and the like are used. Besides, in the projection display device, a projected image may be disturbed in many cases due to the water drop when it rains.

It is also possible that two polarizers are provided on the front surface and the back surface of the light emitting device respectively, whereby one of the polarizers can be slided and the light emitting device switches between a transmission mode in which only one polarizer is superposed on the light emitting device and a non-transmission mode in which two polarizers are superposed on the light emitting element. In the case of displaying map data and data on the present location, a clear image can be obtained by switching to the non-transmission mode.

The other invention is a helmet equipped with a light emitting device which can display with a front scene superposed between a transparent shield and eyes of a person who wears the helmet.

According to the above-described invention, the helmet is equipped with a GPS receiver, and the vehicle is provided with a location data calculating means for calculating a self-location based on a signal from the GPS receiver and a memory means for storing map data, whereby map data is read out from the memory means based on the location data calculating means and the map data is outputted by the light emitting device.

In addition, according to the above-described invention, the light emitting device for the helmet is provided with a plurality of light emitting elements in matrix, wherein a front scene of a person who wears the helmet can be viewed through a non-emitting part when non-emitting.

The light emitting device that can display a far side of the device is installed in a helmet and it can display an image within the forward sight of a driver. Consequently, the driver can view displayed data safely while keeping his eyes ahead at the wheel. When the light emitting device is provided between a transparent shield and eyes of a person who wears the helmet, an image can be displayed within the forward sight of the driver even in the case of the bad weather such as torrential rain.

In this specification, 'transparent to visible light' means that the transmittance of visible light is in the range of 80 to 100% while 'translucent to visible light' means that the transmittance of visible light is in the range of 50 to 80%.

According to the invention, a display can be switched within the forward sight of a driver, thus the driver can view displayed data safely while keeping his eyes ahead at the wheel.

BRIEF DESCRIPTION OF THE DRAWINGS

FIGS. 7A and 7B are views showing a configuration of an active matrix EL display device.

DETAILED DESCRIPTION OF THE INVENTION

Embodiment modes of the invention are described hereinafter.

Figure 1A:
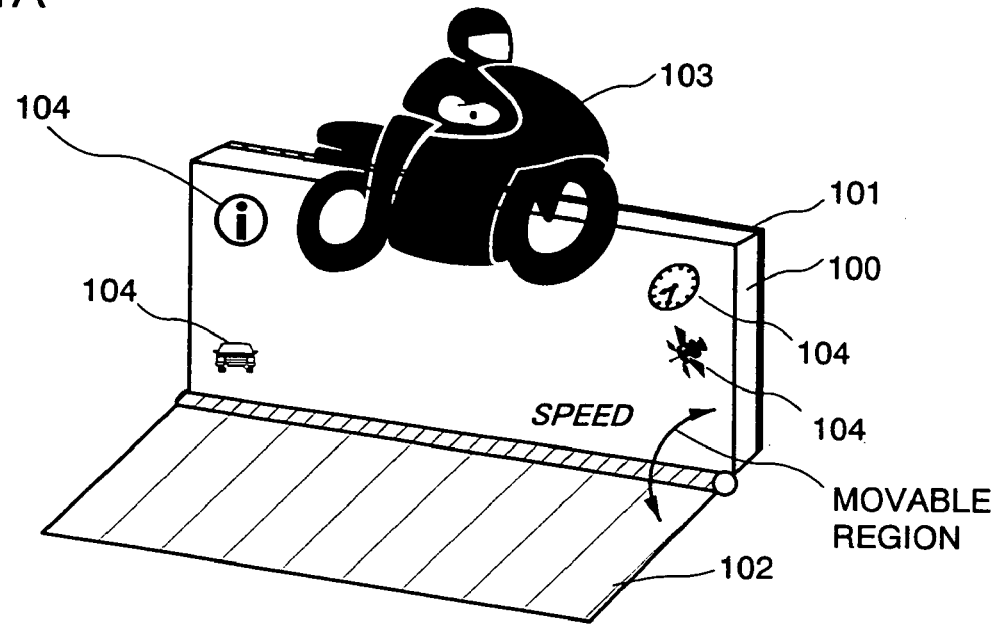
FIGS. 1A and 1B are views illustrating the switching of a display in the light emitting device of the invention.
Figure 1B:
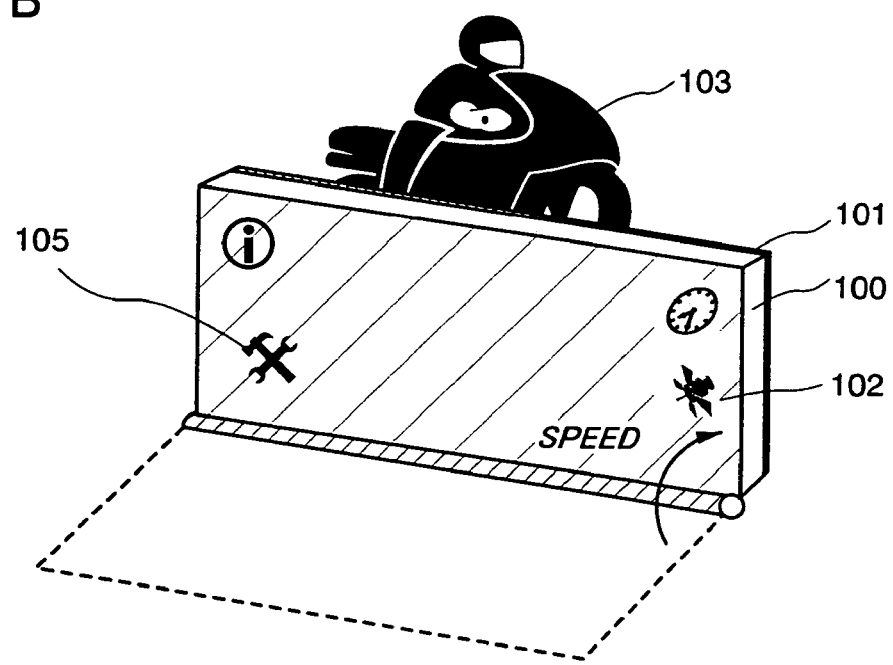

FIGS. 1A and 1B are perspective views illustrating a display of the light emitting device of the invention.

Shown in FIG. 1A is a case of a transmission mode, in which a removable polarizer 102 is not superposed on a light emitting device 100. The light emitting device 100 is transparent or translucent, and a background 103, that is a motorcycle in a front scene is displayed in an area other than lighted portions (a displayed image 104). Note that only one polarizer 101 is superposed on the back surface of the light emitting device 100, so that an observer (not shown) can view the background 103 through the light emitting device 100 and the polarizer 101.

Shown in FIG. 1B is a case of a non-transmission mode, in which the removable polarizer 102 is superposed on the light emitting device 100. The polarizers 102 and 101 provided on the front and back surfaces of the light emitting device 100 respectively are disposed so that their polarizing axes are crossed at right angles with each other. Consequently, a portion in which two polarizers 101 and 102 are superposed on the light emitting device 100 is light-shielded. Therefore, a part of the background 103, that is a part of a motorcycle in a front scene is shielded by the polarizers 101 and 102, so that the observer cannot view a part of the background 103. For example, a warning display 105 is displayed in the non-transmission mode. Light emitted from the light emitting device 100 is transmitted to the polarizer 102 only, and thus the observer can view a display of the light emitting device 100.

Figure 2A:
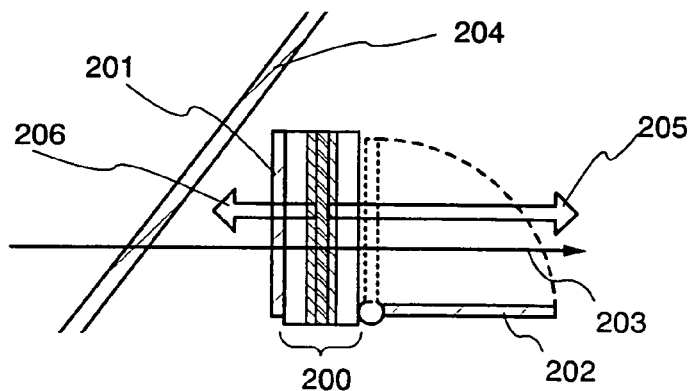
FIGS. 2A to 2C are cross-sectional views of the light emitting device of the invention which is installed in a vehicle.
Figure 2B:
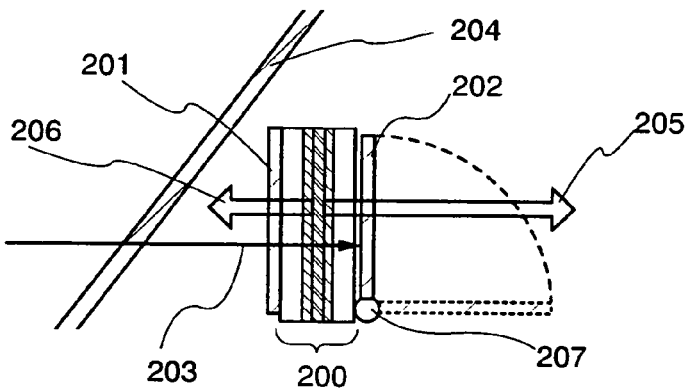
Figure 2C:
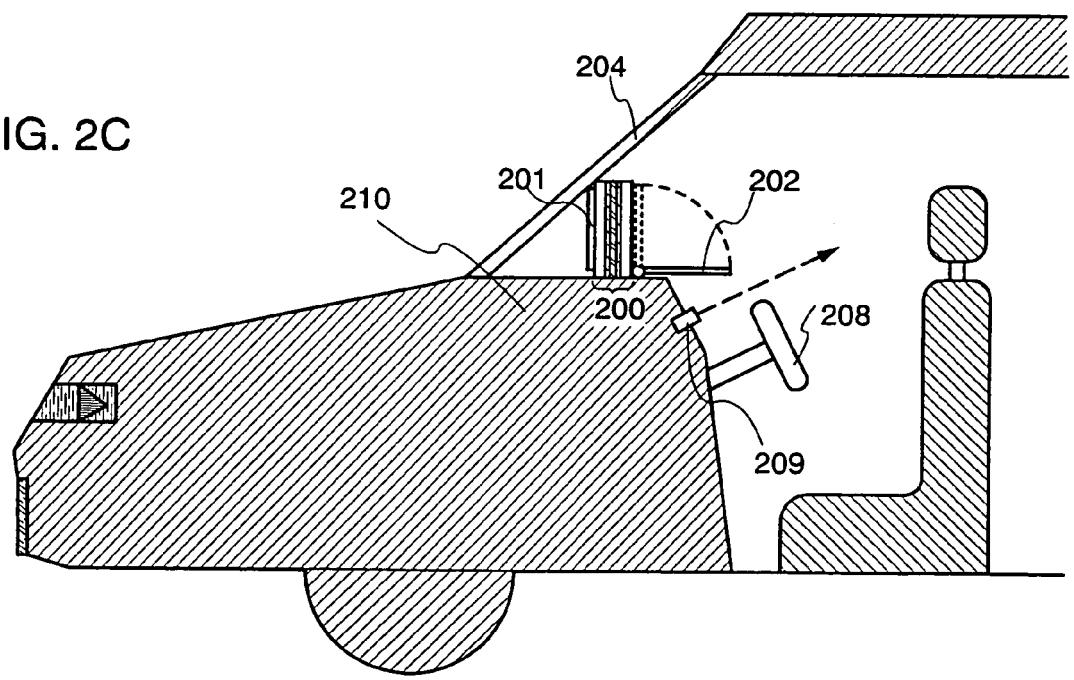

According to the invention, a light emitting device which can switch between a transmission mode and a non-transmission mode by adjusting the removable polarizer 102 is installed in a vehicle, typically on a dashboard as shown in FIG. 2C. The position of the light emitting device is not exclusively limited, and it may be installed above a driver seat so as to display an image in the upper part within the forward sight.

FIGS. 2A and 2B show a light emitting device installed in a windshield of a vehicle. A light emitting panel for vehicle 200 is structured by a pair of light-transmitting electrodes and a light-emitting material as a light-emitting medium sandwiched between the electrodes, which are sandwiched by a pair of light-transmitting substrates.

As the light-emitting material, various materials can be used such as an organic compound material, an inorganic compound material, and a material combining these materials. Luminescence obtained by the light-emitting material includes light emission in returning to a base state from a singlet excited state (fluorescence) and light emission in returning to a base state from a triplet excited state (phosphorescence). Any light-emitting material which emits light through the singlet excited state, the triplet excited state, or both of them can be adopted in the invention.

As the light-transmitting substrate, quartz, glass (e.g., non-alkali glass, reinforced glass, and heat-resistant glass), plastic (e.g., PES (polyether sulfone), PET (polyethylene terephthalate), PEN (polyethylene naphthalate), PI (polyimide)), and other flexible plastic substrates can be used. In the case where the light-transmitting substrate is a flexible substrate, the light emitting device can be installed along a curve of a window-pane of the vehicle.

In addition, the light emitting panel 200 can be fastened by any means. It may be attached by an adhesive agent, or it may be attached by an adhesive tape so as to be removable. Alternatively, the light emitting panel 200 may be attached mechanically by using a jig for fixing.

In the transmission mode shown in FIG. 2A, outside light 203 passes through a windshield to a polarizer 201 and the light emitting panel 200. The light emitting panel for vehicle 200 emits light in both directions of a driver and of the windshield 204, that is two light emitting directions denoted by 205 and 206 in FIG. 2A. Note that the light emitted in the direction of the windshield is light-shielded in some degree because it passes through the polarizer 201.

In the non-transmission mode shown in FIG. 2B, the outside light 203 passes through the windshield to the polarizer 201 and the light emitting panel 200, and then the light is shielded by another polarizer 202. The polarizer 202 is adjusted based on a movable axis 207 within the forward sight. The light emitting panel for vehicle 200 emits light in both directions of a driver and of the windshield, that is two light emitting directions denoted by 205 and 206 in FIG. 2B.

FIG. 2C shows a whole structure of a vehicle installed with the light emitting panel for vehicle 200. Reference numeral 210 denotes a vehicle body, 208 denotes a steering wheel, and 209 denotes a CCD camera. The CCD camera 209 detects driver's living body information (degree of eye afflux, leaden-eyed facial expression, opened degree of pupils, and the like). Depending on the data, the light emitting panel for vehicle 200 performs a warning display or a speaker outputs an alarm sound. A pulse wave sensor, a temperature sensor, or a pressure sensor may be provided in a part of the steering wheel 208 to obtain driver's living body information (pulse wave, body surface temperature, grip strength, and the like). In addition, the driver may wear a wristwatch provided with a pulse wave sensor and a temperature sensor, whereby obtained data can be sent to a driving support system by a sender.

Driver's mental and physical conditions may be judged by a living body information detecting means so that a warning is given to the driver only when the obtained data has a value within a certain range or matches a certain condition. However, it is preferable to utilize the chaos theory in order to judge the driver's mental and physical conditions more accurately.

Driver's living body information is embedded in m (m is four or more)-dimensional space to construct an attracter and it is compared with the definition of the chaos in order to obtain the driver's mental and physical conditions. A part of the procedure is briefly explained below.

In an m-dimensional dynamical system, the change order of the state of the system at a certain hour is shown by m functions of state variables. A time-series signal of one variable is measured by one detecting means as shown by Formula 1.

$$\xi_1, \xi_2, \ldots, \xi_i, \ldots \quad \text{Formula 1}$$

Next, an attracter for a dynamical system in high-dimensional space is constructed by the time-series signal. Here, the attracter is constructed by a method of using a difference per certain period. Assuming that the amount of delay per period is T (sampling period×a), an m-dimensional vector is constructed in an m-dimensional embedded space by using the time-series signal $\xi_1$ as shown in Formula 2, for example.

$$X_1 = (\xi_1, \xi_{1+a}, \ldots, \xi_{1+(m-1)a})$$
$$X_2 = (\xi_2, \xi_{2+a}, \ldots, \xi_{2+(m-1)a})$$
$$X_3 = (\xi_3, \xi_{3+a}, \ldots, \xi_{3+(m-1)a})$$
$$\vdots$$
$$X_N = (\xi_N, \xi_{N+a}, \ldots, \xi_{N+(m-1)a})$$

Formula 2

X shown in Formula 2 consists of m ξs and is constructed by a value of ξ per delay period T (sampling period×a).

The chaos software is utilized, by which an obtained time-series signal is embedded in the multi-dimensional space and a projection plane or an attractor can be picked out as described in above procedure. The projection plane or the attractor (a pattern obtained from random data by chaos processing) obtained by the execution of the chaos software by a CPU and the like is verified in comparison with a predetermined pattern of a driver which is stored in a memory (pattern concerning the case where the driver's concentration is on the decrease and the case where he is unstable mentally, physically, or physiologically). Then, lyapunov index is obtained by calculating the degree of the pattern check and a warning display, an alarm sound, and the like are given to the driver based on a value of the lyapunov index.

For example, when the driver's mental and physical conditions are in the 'sleepy' condition, a computer catches the driver's condition by analyzing data from the living body information sensor with the chaos software to output a warning display such as strong light emission and red light emission or an alarm sound in order to call the driver's attention.

A display by light emission on the front side is seen with left and right reversed when it is seen by a pedestrian or a driver of a car coming from the opposite direction. However, a driver of the preceding vehicle can see the same display as the one which a driver of a vehicle provided with the light emitting panel for vehicle 200. Therefore, in the case where any message is displayed in the light emitting panel for vehicle 200, the driver of the preceding vehicle can read the message of the behind car when he sees the light emitting panel for vehicle 200 with a rearview.

Furthermore, since the light emitting panel for vehicle 200 transmits light, it can be installed on a hood without blocking a driver's view. Accordingly, the driver can view the outside of the vehicle while catching data from a displayed image, so that the safe driving and convenience are realized. The light emitting panel for vehicle of the invention is also thin and lightweight, thus, it can be utilized efficiently even in the narrow space such as the inside of a vehicle.

A transmission mode shown in FIG. 2A is suitable for constantly displaying data on the drive of vehicle such as the driving speed and the number of rotation of engine. The driver can check the data on the drive of vehicle during driving only by changing the view point instantaneously while keeping his eyes ahead.

A non-transmission mode shown in FIG. 2B is suitable for temporarily displaying data on a warning and on map data which is a high resolution display. When a warning display is performed to alarm for engine trouble, for forgetting parking brake return, for not wearing the seat belt, or the like in the non-transmission mode, the warning display is displayed within the forward sight of the driver, and therefore, the driver can view the display instantaneously. The non-transmission mode is also suitable for displaying under the condition difficult to recognize an image, namely due to a headlight of a car coming from the opposite direction, a strong sunray, and the like.

A driving support system may be constructed so as to have a function of switching appropriately between a transmission mode and a non-transmission mode by gearing a movable part of a polarizer to CPU.

Figure 3A:
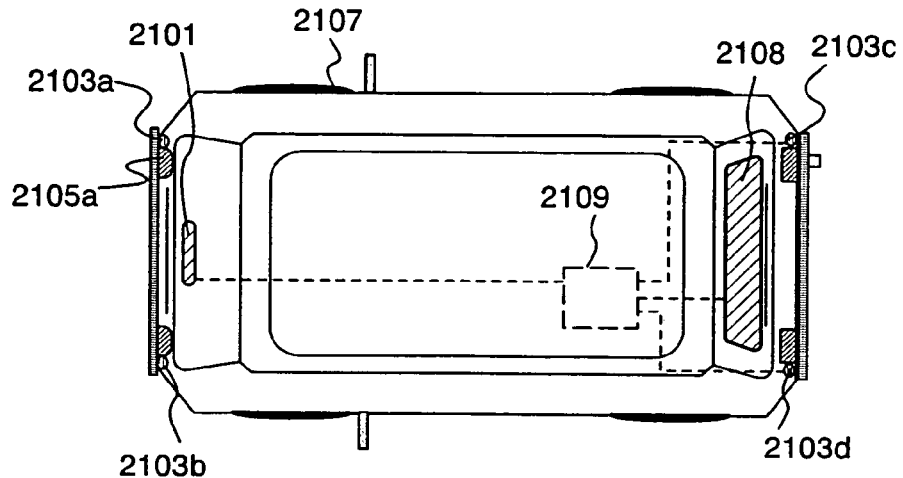
FIGS. 3A to 3C are views of the light emitting device of the invention which is installed in a vehicle.
Figure 3B:
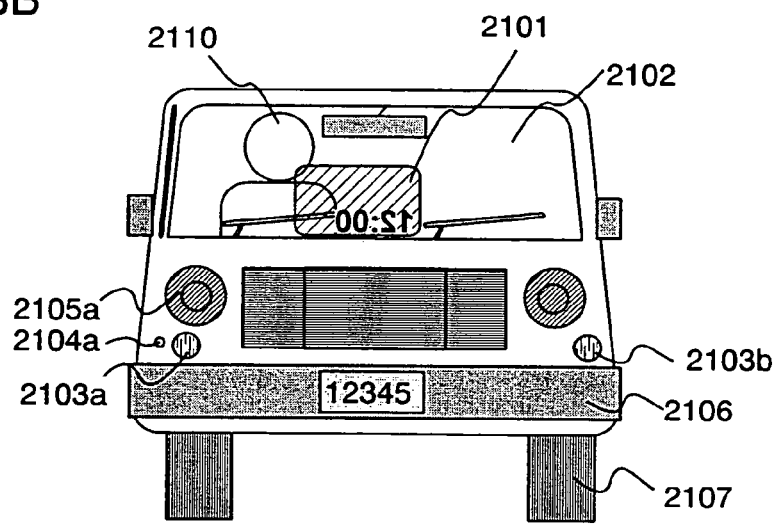
Figure 3C:

FIG. 3A is a top view of a vehicle, FIG. 3B is a frontside elevational view thereof, and FIG. 3C is a backside elevational view thereof. In FIGS. 3A to 3C, reference numeral 2102 denotes a windshield, 2103a to 2103d denote cameras, 2104a and 2104b denote sensors, 2105a and 2105b denote lights, 2106 denotes a bumper, 2107 denotes a wheel, 2109 denotes a CPU, 2110 denotes a driver, and 2111 denotes a rear window glass. Note that the vehicle is equipped with an energy source such as electricity and gasoline, a motor such as an engine for supplying motive energy, a motive energy transmission device, a braking device, a steering device, a suspension device, the replacement equipment, an accessory, and the like though not shown. The number of cameras, sensors, and microphones and the arrangement thereof are not limited to those shown in FIGS. 3A to 3C, and they can be determined appropriately.

Display devices for vehicle are installed in the windshield 2102 and in the rear window glass 2111 which is a rear side window. The display device for vehicle of the invention has a function of transmitting light and a function of displaying an image, so that the display device for vehicle can display an image if necessary while guarding a driver without blocking view. In addition, a transmission mode and a non-transmission mode can be switched by moving the polarizer appropriately. Accordingly, a vehicle having higher performance and higher added value can be provided.

In the transmission mode, the display device for vehicle of the invention does not block view of the driver 2110 because it transmits light. Therefore, images such as a clock display and speed meter display can be displayed on a windshield as a display A 2101. Display contents and the switching between a display and a non-display can be controlled by the driver by using a switch appropriately.

The sensors 2104a and 2104b and the cameras 2103a to 2103d may be provided in a vehicle as shown in FIGS. 3A to 3C in order to display data. Data detected by such detecting means for detecting outside data of the vehicle is stored by a memory medium such as a memory, and then displayed by a data display means. In addition, a speaker inside the vehicle may be used in order to give a hazard warning and the like to the driver by both a display function and a sound. In the case of a warning display, the non-transmission mode is suitable with the polarizer moved. The non-transmission mode is also suitable for the case where the measured light intensity of the outside light exceeds a certain level, over which a display is difficult to recognize. For the above system, a CPU is preferably provided inside the vehicle so as to connect all factors to the CPU.

In FIGS. 3A to 3C, a display portion B 2108 is geared to the CPU 2109 through an obstruction sensor. Although a warning is displayed after switching to the non-transmission mode by moving the polarizer in FIGS. 3A to 3C, a road obstruction and a vehicle condition may be displayed with an image by the camera 2103d to inform to the driver and a person outside the vehicle. As described above, a vehicle equipped with the display device for vehicle of the invention is a vehicle with high added value which enables the safe and comfortable driving for a driver and a pedestrian.

The vehicle to which the invention is applied includes a passenger car, a sport car, a truck, a bus, a station wagon, a special purpose car (such as an ambulance car), a special kind car (such as a tractor), a specially equipped car (such as a tanker), an electric train, and an automatic two-wheeled vehicle.

In addition, it is valuable to use the invention as a car navigation system with a display portion thereof installed on a windshield. The car navigation system is a device by which data on the present location, the driving direction, and the like of a moving vehicle are measured by using an artificial satellite, a magnetic device, an odometer, or the like, and the measured data is displayed on a screen inside the car to be informed to a driver. A display screen of a conventional car navigation system is installed below a windshield in many cases, and therefore, a driver may not be able to keep his eyes ahead at the wheel. The car navigation system according to the invention comprises the above-described detecting means for detecting a vehicle and a surrounding circumstance of a vehicle, a memory means for storing the data, and a display means for displaying the data, whereby the data is displayed on a windshield of the vehicle. A driver can catch data from a displayed image by the car navigation system while viewing people and road conditions outside the vehicle in the driving direction. The safe, convenient, and comfortable driving is realized consequently.

The display device for vehicle of the invention may be installed anywhere appropriately such as a windowpane in the side of the vehicle and a windowpane in the upper (ceiling) of the vehicle, namely a sunroof, as well as a windshield and a rear window glass.

The above-described invention is explained in the following embodiments in more detail.

EMOBODIMENT 1

In this embodiment, a dual emission light emitting device is described with reference to FIGS. 4A and 4B.

Figure 4A:
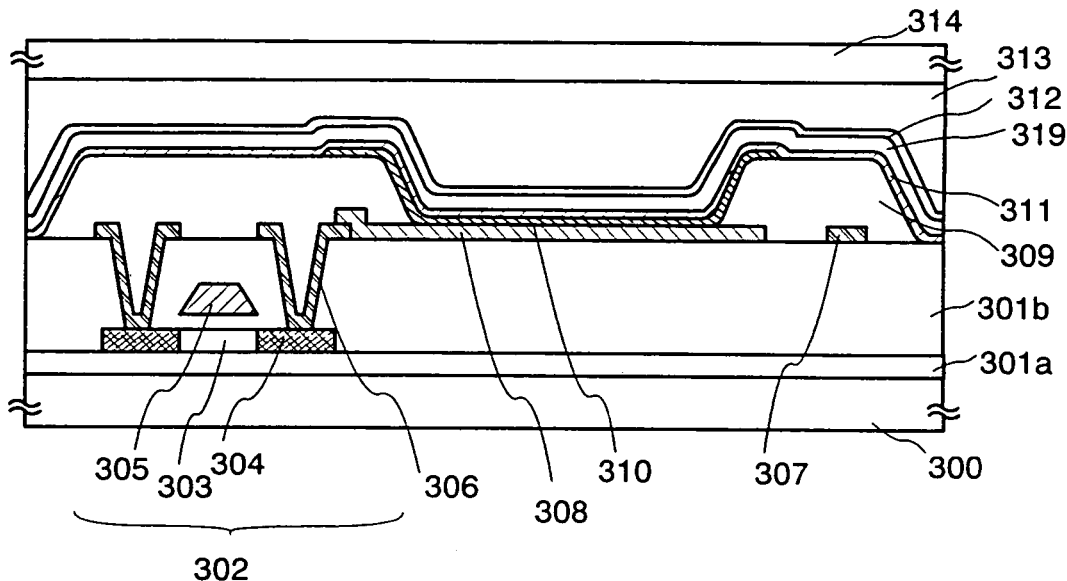
FIGS. 4A and 4B are cross-sectional views of the light emitting element of the invention.

FIG. 4A is a cross sectional diagram showing a part of a pixel portion. FIG. 4B is a schematic diagram showing a laminated structure of a light emitting area. As shown in FIG. 4B, light can be emitted in both directions of the top side and the bottom side. Note that an arrangement of the light emitting area, namely an arrangement of a pixel electrode can adopt a stripe arrangement, a delta arrangement, a mosaic arrangement, and the like.

In FIG. 4A, reference numeral 300 denotes a first substrate, 301 (301a and 301b) refers to insulating layers, 302 refers to a TFT, 308 refers to a first electrode (transparent conductive layer), 309 denotes an insulator (also referred to as a partition or a bank), 310 denotes an EL layer, 311 refers to a second electrode such as Ag, 319 denotes a transparent conductive layer, 312 refers to a transparent protective layer, 313 refers to a transparent sealing material, and 314 refers to a second substrate.

A TFT 302 (P-channel TFT) formed on the first substrate 300 is an element for controlling a current flowing into the EL layer 310 which emits light. Reference numeral 304 denotes a drain region (or a source region). In addition, reference numeral 306 denotes a drain electrode (or a source electrode) which connects the first electrode to the drain region (or the source region) 304. A wiring 307 which corresponds to a power supply line, a source line, or the like is formed in the same steps as the drain electrode 306. The example shown here is the case where the first electrode and the drain electrode are separately formed, however, they may be integrated as well. Over the first substrate 300, an insulating layer 301a which serves as a base insulating film (the lower layer is a nitride insulating film and the upper layer is an oxide insulating film) is formed. A gate insulating film is provided between the gate electrode 305 and an active layer. A reference numeral 301b denotes an interlayer insulating film formed of an organic material or an inorganic material. In addition, although not shown, one pixel includes one or more other TFTs (N-channel TFT or P-channel TFT). Although the TFT shown here includes one channel forming region 303, the invention is not limited to this. The TFT may include a plurality of channels.

In addition, although a top gate TFT is taken as an example here, the invention can be applied to any TFT structures. For example, it can be applied to a bottom gate (inverted staggered) TFT or a staggered TFT.

The first electrode 308 is formed of a transparent conductive film, namely it is an anode (or a cathode) of an EL element. As the transparent conductive film, ITO (indium tin oxide), $In_2O_3$—ZnO (indium oxide-zinc oxide), ZnO (zinc oxide), or the like can be used.

The insulator 309 is formed so as to cover ends of the first electrode 308 (and the wiring 307). As the insulator 309, an inorganic material (oxide silicon, nitride silicon, oxynitride silicon, or the like), a photosensitive or non-photosensitive organic material (polyimide, acrylic, polyamide, polyimidamide, resist or benzocyclobutene), or a laminate of these materials can be used. Here, photosensitive organic resin covered with a nitride silicon film is used. In the case of using a positive type photosensitive acrylic as a material for the organic resin, for example, it is preferable that only top ends of the insulator have a surface having a curvature radius. Alternatively, negative type photosensitive organic resin which becomes insoluble in etchant according to light or positive type organic resin which becomes soluble in etchant according to light can be used as the insulator 309.

The organic compound EL layer 310 is formed by vapor deposition or application method. In this embodiment, the organic compound EL layer 310 is deposited by a vapor deposition system to obtain a uniform thickness. Note that the organic compound EL layer 310 is preferably degassed by vacuum heating (100° C. to 250° C.) immediately before the deposition to enhance the reliability. For example, in the case of using the vapor deposition, the deposition is performed in a deposition chamber which is vacuum evacuated down to a vacuum degree of $5 \times 10^{-3}$ Torr (0.665 Pa) or less, and more preferably to $10^{-4}$ to $10^{-6}$ Pa. In the deposition, the organic compound is evaporated by resistance heating in advance, and it is scattered in the direction of the substrate when a shutter is opened at deposition. The evaporated organic compound is scattered upward, and it is deposited onto the substrate through an opening provided in a metal mask.

The EL layer (organic compound layer) 310 includes an HIL (Hole Injection Layer), an HTL (Hole Transporting Layer), an EML (EMitting Layer), an ETL (Electron Transporting layer), and an EIL (Electron Injection Layer) which are laminated in this order from the anode side. Typically, CuPc is used for the HIL, α-NPD is used for the HTL, BCP is used for the ETL, and BCP: Li is used for the EIL.

As for the EL layer (organic compound layer) 310, specifically, material layers which emit red, green, and blue light respectively are required to be deposited selectively by vapor deposition using a deposition mask, ink-jet printing method, or the like appropriately.

The invention is not limited to the above laminated structure of the EL layer. In the case of forming the organic compound EL layer 310 for green emission for example, α-NPD having a thickness of 60 nm is deposited. Then, by using the same mask, $Alq_3$ having a thickness of 40 nm which is doped with DMQD as a green EML, $Alq_3$ having a thickness of 40 nm as an ETL, and $CaF_2$ having a thickness of 1 nm as an EIL are sequentially deposited. In the case of forming the organic compound EL layer 310 for blue emission for example, α-NPD having a thickness of 60 nm is deposited. Then, by using the same mask, BCP having a thickness of 10 nm as a blocking layer, $Alq_3$ having a thickness of 40 nm as an ETL, and $CaF_2$ as an EIL are sequentially deposited. In the case of forming the organic compound EL layer 310 for red emission for example, α-NPD having a thickness of 60 nm is deposited. Then, by using the same mask, $Alq_3$ having a thickness of 40 nm which is doped with DCM as a red EML, $Alq_3$ having a thickness of 40 nm as an ETL, and $CaF_2$ having a thickness of 1 nm as an EIL are sequentially deposited.

Alternatively, a light emitting device capable of performing a full color display can be fabricated by additionally providing a color filter, a color conversion layer, and the like in an EL element which emits white light. In the case of applying the invention to a display device for only a simple display, namely a lighting system, mono-color emission (typically, white emission) is only required. For example, white emission can be obtained by dispersing 1,3,4 oxadiazole derivative (PBD) which can transport electrons in polyvinylcarbazole (PVK) which can transport holes. Alternatively, white emission can be obtained by dispersing 30 wt % of PBD as an electron transporting agent and then dispersing four kinds of pigmanet (TPB, Coumarin 6, DCM 1 and Nile Red) by an appropriate amount. Further, by appropriately selecting each of the organic compound films for red, green and blue emission and thereby mixing the selected colors, white emission as a whole can be obtained.

The second electrode 311 is formed of a conductive film, that is the cathode (or the anode) of the EL element. As a material for forming the second electrode 311, an alloy such as MgAg, MgIn, AlLi $CaF_2$ and CaN, or a metal thin film having light transmissivity formed by co-depositing aluminium and an element that belongs to the first group or the second group of a periodic table is used. Here, light is emitted in both directions of the top side and the bottom side through the second electrode, therefore, an aluminum film having a thickness of 6 nm to 10 nm or an aluminium film including the slight amount of Li is used. When the Al film is used as the second electrode 311, the organic compound EL layer 310 can be formed by using a material other than an oxide, which improves the reliability of the light emitting device. Alternatively, a film having light transmissivity (having a thickness of 1 nm to 5 nm) can be formed as a buffer layer using $CaF_2$, $MgF_2$ or $BaF_2$ before forming the aluminium film having a thickness of 6 to 10 nm.

Light transmissivity, absorptivity, and reflectivity are made equal in each of the top emission and the bottom emission, therefore, a transparent conductive film (ITO, $In_2O_3$-ZnO, ZnO, or the like) is required to be formed to have a thickness of 240 to 290 nm, or 380 to 500 nm over the metal thin film having a thickness of 6 to 10 nm in order to reduce resistance of the cathode. Thus, a difference between each display of the top emission and the bottom emission is eliminated. In addition, an auxiliary electrode may be provided on the non-light emitting area of the second electrode 311 in order to reduce resistance of the cathode. In the formation of the cathode, it is required to be formed selectively using a deposition mask by resistance heating as vapor deposition, The reference numeral 312 is a transparent protective film formed by sputtering or vapor deposition, which serves as a sealing film for protecting the second electrode 311 formed of a metal thin film while blocking out moisture. The transparent protective film 312 can be formed by a nitride silicon film, an oxide silicon film, an oxynitride silicon film (SiNO film (composition ratio of N>O) or SiOn film (composition ratio of N<O)), or a thin film including carbon as a main component. These non-insulating films have high blocking effect against moisture and oxygen, however, they are likely to be peeled off when formed thick since a film pressure is increased correspondingly.

The transparent protective film 312 formed in this manner is best suited for the sealing film of the EL element having an organic compound EL layer. Note that the second substrate 314 and the first substrate 300 are attached with a sealing material having a gap material for securing the space between the substrates.

Alternatively, a protective film may be formed by laminating a first inorganic insulating film, a stress relaxation film, and a second inorganic insulating film on the cathode in this order. For example, after forming the first inorganic insulating film having a thickness of 5 to 50 nm over the cathode, the stress relaxation film (such as an organic compound layer) having hygroscopic property, transparency, and a thickness of 10 nm to 100 nm is formed thereover by vapor deposition, and then the second inorganic insulating film is formed to have a thickness of 5 to 50 nm. Further, the above laminate of the stress relaxation film and the inorganic insulating films may be provided in two or more layers.

As for a material for forming the second substrate 314, a plastic substrate formed of an FRP (Fiberglass-Reinforced Plastic), PVF (Polyvinylfluoride), mylar, polyester, acrylic, or the like may be used as well as a glass substrate and a quartz substrate.

As the sealing material 313 as a filler, any light transmitting material can be used. Typically, ultraviolet curable or heat curable epoxy resin is preferably used. Here, highly heat-resistant UV epoxy resin (manufactured by ELECTRO-LITE CORPORATION: 2500 Clear) is used, which has a refraction factor of 1.50, viscosity of 500 cps, hardness of 90 D, tensil strength of 3000 psi, glass transition temperature of 150° C., volume resistance of $1 \times 10^{15}$ ohm/cm, and dielectric strength of 450 V/mil. In addition, by filling a transparent sealing material between the pair of substrates, light transmissivity as a whole can be enhanced as compared to the case of filling air (inert gas atmosphere) between them.

Described in this embodiment is an example in which the space between the pair of substrates is filled with the sealing material 313, however, air gap (inert gas atmosphere) may be provided between them as well.

This embodiment can be freely implemented with embodiment mode.

EMBODIMENT 2

Figure 5A:
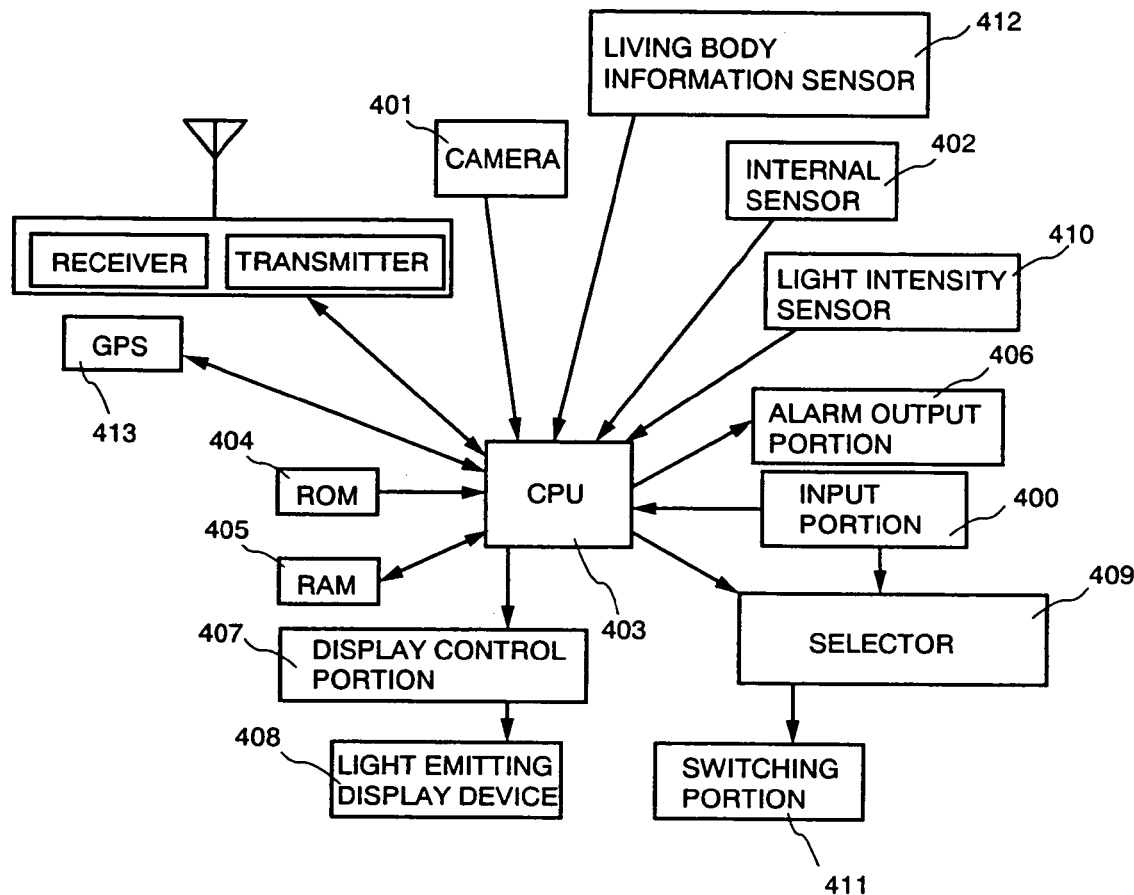
FIGS. 5A and 5B are block diagrams showing the driving support system of the invention.

FIG. 5A shows a functional configuration (configuration means) of a driving support system of this embodiment.

A GPS 413 receives a location signal with respect to the present location such as latitude and longitude data from a satellite using an antenna, a receiver, a transmitter, and the like, and then it reads out either or both of the detected signal and the location signal in order to measure the present location.

Figure 5B:
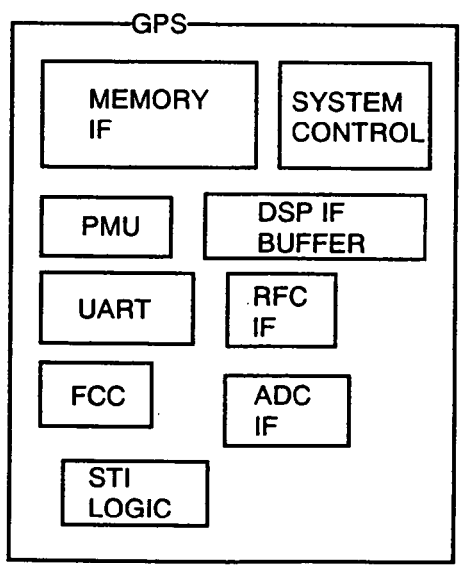

FIG. 5B shows a functional block which configures the GPS. The functional block of the GPS includes a System Control, a Memory IF (Memory Interface), a PMU (Path Memory Unit), a UART (Universal Asynchronous Receiver/Transmitter system), an FCC, a DSP IF Buffer (DSP (Digital Signal Processor) Interface Buffer), an RFC IF (Radio Frequency Choke coil Interface), an ADC IF (A-D converter Interface), an STI Logic (Set Interrupt Logic), and the like.

Note that two different pieces of the above functional block may be connected to each other using a glue logic (Glue Logic) which operates functional blocks connected in parallel together.

A shooting means for detecting circumstances detects surrounding circumstances whether there is any vehicle or obstruction ahead and if any, it measures a distance from them using a camera 401 (an infrared camera, a high-definition camera, and the like). An internal sensor 402 includes a running speed meter, a positional angle meter, an operating angle meter, and the like. In addition, an external sensor (not shown) including a milli-meter wave radar and laser data may be provided as well. A living body information sensor of a driver 412 includes a brain wave sensor, a pulse wave sensor, a skin temperature sensor, an eye blink sensor for detecting blinking, a CCD for shooting an image of a facial expression, degree of eye afflux, or opened degree of pupils, or the like.

A CPU 403 judges whether the user's vehicle can run smoothly based on the data from the camera 401 and the internal sensor 402. Although one CPU is shown here, a plurality of CPUs can be used as well. The CPU 403 uses a ROM 404, a RAM 405, and a disk memory device (not shown) as storing means, and executes instructions regarding various memories, operations, input/output, and the like according to inputted programs. An input portion 400 includes input components such as an operating switch, a microphone, a touch panel, and the like, by which a user can specify a broad instruction for the whole system.

Driving data obtained by the internal sensor 402 is transmitted through a wiring in a data signal format with power to the CPU 403 and to a display control portion 407. Then, it is outputted to a light emitting display device 408. Since the light emitting display device 408 of the invention transmits light, driver's sight is not disturbed. Accordingly, images such as a clock display and speed meter display can be displayed within the sight of the driver. In addition, switching of a display and a non-display can be controlled by a driver using the input portion 400, for example by using the operating switch as needed.

In addition, the driver can switch the light emitting display device 408 to a non-transmission mode using the input portion 400, for example by using the operating switch. Also, in the case where a warning display is given to the driver to warn that there is an obstruction ahead the driver's vehicle when the CPU 403 detects any obstruction which interrupts his driving based on the data from the camera 401 and the internal sensor 402, the light emitting display device 408 is switched to a non-transmission mode. When the light emitting display device 408 is switched from a transmission mode to a non-transmission mode, a selector 409 for determining a transmission mode or non-transmission mode is turned ON or OFF, whereby a polarizer is overlapped with the light emitting device 408 using a switching portion 411 for selecting insertion and removal of the polarizer.

When it is judged that the driver is likely to fall asleep at the wheel based on the living body information of the driver (for example, his leaden-eyed facial expression, eye strain, or abnormal brain wave) from a living body information sensor 412, a warning display or an alarm are given to the driver.

At the same time, an alarm output portion 406 outputs audible data such as an alarm sound or a voice concurrently with the warning display.

According to the driving support system of this embodiment, a driver can clearly recognize a visual warning by a display and an audible warning while securing his sight in the forward direction.

In the case where light which is came from outside of the vehicle is strong, the light emitting display device 408 switches from a transmission mode to a non-transmission mode based on the data from a light intensity sensor 410 in order that the displayed image is recognized clearly.

The driving support system of this embodiment can realize a display which is clearly recognized by a driver according to the surrounding circumstances.

Further, a navigation system based on the GPS 413 is mounted. It can display a map with high resolution in a non-transmission mode when a vehicle is parked, while switching to a transmission mode when a driver is at the wheel in order to display an image which does not interrupt his driving.

Note that various peripheral devices are connected to the CPU 403 through interfaces (not shown).

Figure 6:
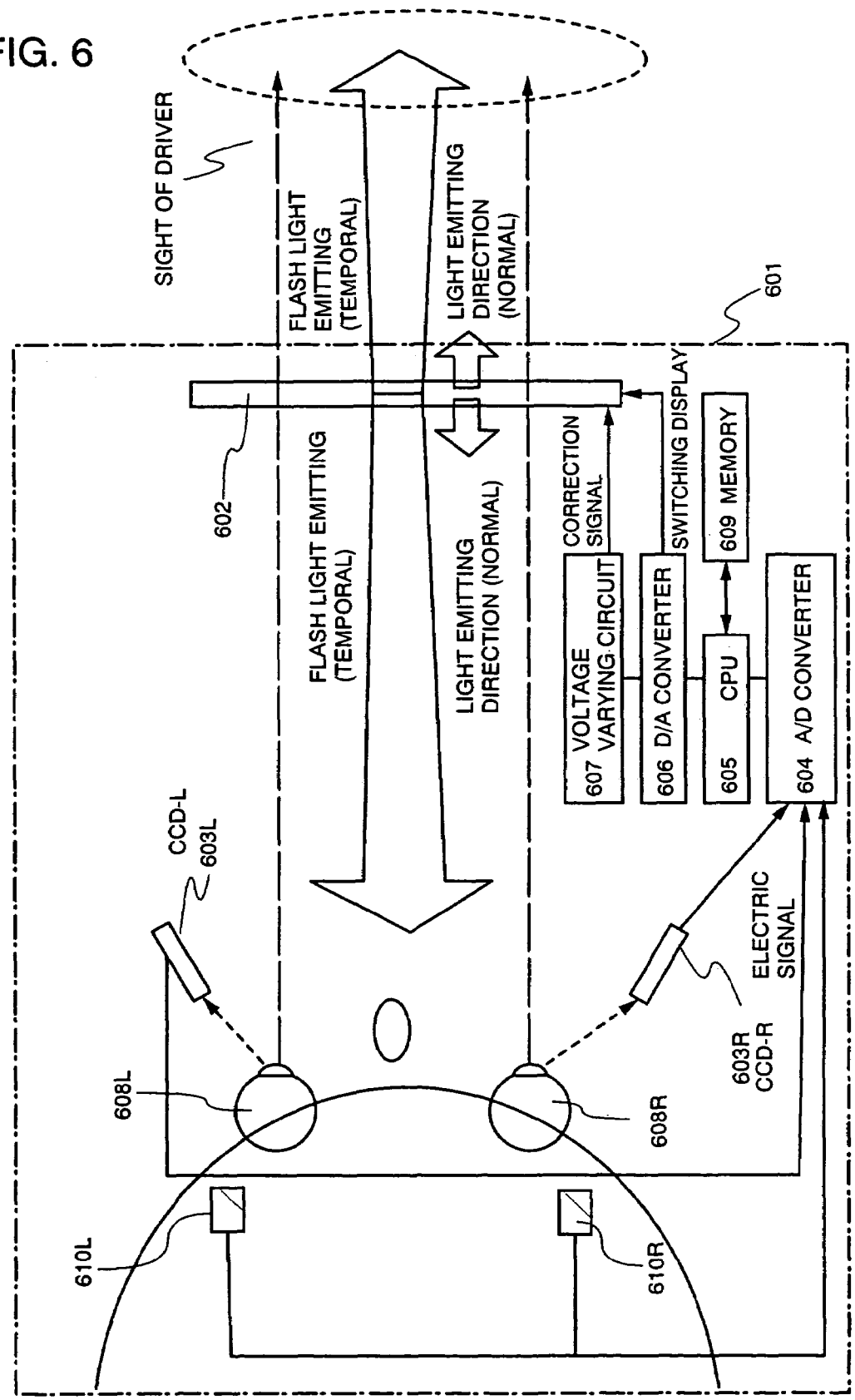
FIG. 6 is a pattern diagram showing the driving support system of the invention.

FIG. 6 schematically shows a relationship between a living body information sensor of a driver, a CPU, and a display device, each of which is a part of a driving support system among the afore-mentioned integration system. Reference numeral 602 denotes a light emitting device (also referred to as an EL display) which can freely switch between a transmission mode in which both of a front scene and a display can be recognized while being overlapped with each other and a non-transmission mode in which a front scene is shielded and only a display can thus be recognized. Note that FIG. 6 shows an example of a transmission mode in which both of the front scene and the display can be recognized while being overlapped with each other.

Reference numerals 603L and 603R denote CCDs, which shoot a left eye and a right eye of a driver respectively in order to detect living body information signals of him. Reference numerals 610 L and 610R denote brain wave sensors, which detect living body information signals from electrodes attached to a left temple and a right temple of the driver respectively. The example shown here employs the CCDs for shooting eyes of a driver and the brainwave sensors, however, the invention is not limited to this. As an alternative means for detecting living body information signals, a pulse sensor, a skin temperature sensor, an eye blink sensor for detecting blinking, and the like may be provided.

The detected living body information signal is inputted to an A/D converter 604 as an electric signal. The signal is converted into a digital electric signal in the A/D converter 604, and then inputted to a CPU 605.

The CPU 605 makes a comparison between the inputted digital electric signal and normal data which is stored in a memory 609 (data of a driver in a mentally stable condition), thereby judging the physical and mental conditions of the driver (whether or not his eyes are open, he is concentrating on driving, or the like).

In order to judge the physical and mental conditions of the driver even more accurately, chaos software (not shown) may be used as well. By putting driving data such as the condition of a road surface, map data, driving speed, positional angle, operating angle, and temperature inside the vehicle into multidimensional space by chaos processing, a shape of an attractor and a planar projection can be obtained.

The planar projection and the attractor (pattern obtained from random living body information by chaos processing) obtained by the execution of the chaos software by the CPU 605 are verified in comparison with a predetermined pattern of a driver which is stored in the memory 609 (a pattern concerning the case where the driver's concentration on the decrease and a case where he is unstable mentally, physically, or physiologically). Then, the verification result of the pattern is obtained from a lyapunov index. Based on the value, a correction signal (or warning display signal) for giving a warning display to a driver is inputted to a D/A converter 606.

The correction signal (or warning display signal) inputted to the D/A converter 606 is converted into a digital correction signal (or warning display signal). When the digital correction signal (or warning display signal) is inputted to a voltage varying circuit 607, the voltage varying circuit 607 applies a correction potential to each EL element according to the digital correction signal (or warning display signal). Note that reference numerals 608L and 608R correspond to a left eye and a right eye of a driver respectively.

When a display is required to be changed according to the condition of a driver, a signal is converted into a correction signal (or warning display signal) according to a degree of eye afflux and a brain wave of the driver. For example, when the CPU recognizes that the driver is irritated by a traffic jam, it sends an instruction for displaying a relaxing image (for example, such as a blue display and a blue image).

In the case of giving a warning display to a driver for preventing him from falling asleep at the wheel, the EL display device 602 is switched to a non-transmission mode temporarily. Alternatively, a highly impressive display is performed by a correction signal (such as a red display, a red image, and flashing display, for example) in order to give an impulse to the drivers' eyes.

When a strong current (warning display signal) is supplied to the EL display device 602 which uses an organic compound layer as a light emitting layer, within the range in which a light emitting element thereof can stand the current, a luminance twice as large as that in the normal image display can be outputted, thus an instantaneous flash can be set off. For example, in the case where the driving support system 601 judges that the driver is likely to fall asleep at the wheel, intense whole area emission (flashing) can be performed instantaneously to give an impulse to the drivers' eyes, thereby giving him a warning, while drawing attention of a driver of the preceding vehicle.

This embodiment can be freely implemented with embodiment mode or Embodiment 1.

EMBODIMENT 3

FIG. 7A shows an example of fabricating a light emitting device (of a dual emission structure) having a light emitting element including an organic compound layer as a light emitting layer, over a substrate having an insulating surface.

FIG. 7A is a top plan view of a light emitting device. FIG. 7B is a cross sectional view taken along a line A-A' in FIG. 7A. Portions surrounded by dotted lines 1101, 1102, and 1103 denote a source signal line driver circuit, a pixel portion, and a gate signal line driver circuit respectively. Reference numeral 1104 denotes a transparent sealing substrate and 1105 denotes a first sealing material. A portion surrounded by the first sealing material 1105 is filled with a second transparent sealing material 1107. Note that the first sealing material 1105 includes a gap material for securing space between substrates.

Reference numeral 1108 denotes a wiring for transmitting signals between the source signal line driver circuit 1101 and the gate signal line driver circuit 1103, and it receives a video signal and a clock signal from an FPC (Flexible Printed Circuit) 1109 as an external input terminal. Although only the FPC is shown here, the FPC is provided with a printed wiring board (PWB). Resin 1150 is provided so as to cover the FPC 1109.

The cross sectional structure is described with reference to FIG. 7B. A driver circuit and a pixel portion are formed over a transparent substrate 1110. Here, the source signal line driver circuit 1101 as the driver circuit and the pixel portion 1102 are shown.

The source signal line driver circuit 1101 is formed by a CMOS circuit combining an N-channel TFT 1123 and a P-channel TFT 1124. The driver circuit may be formed by a known CMOS circuit or NMOS circuit including TFTs. The driver circuit is integrated on the substrate in this embodiment, however, the invention is not limited to this, and it may be formed outside of the substrate. In addition, the structure of the TFT is not limited to the one having a polysilicon film or an amorphous silicon film as an active layer. It may be a top gate TFT or a bottom gate TFT.

The pixel portion 1102 includes a plurality of pixels each having a switching TFT 1111 and a current controlling TFT 1112 whose drain is electrically connected to a first electrode (anode) 1113. The current controlling TFT 1112 may be either an N-channel TFT or a P-channel TFT. However, the current controlling TFT 1112 is preferably a P-channel TFT when it is connected to the anode. In addition, a storage capacitor (not shown) is preferably provided appropriately. Note that shown here is the cross sectional structure of one pixel including two TFTs among a number of disposed pixels, however, the number of TFTs may be three or more.

The first electrode 1113 is directly connected to a drain of the current controlling TFT 1112. Therefore, it is preferable that a material layer including silicon which is capable of having an ohmic contact with the drain is used for the lower layer of the first electrode 1113, and a material layer having a high work function is used for the top layer of the first electrode 1113 which is in contact with an organic compound layer. For example, a transparent conductive film (ITO, $In_2O_3$—ZnO, ZnO, or the like) is used.

An insulator (also referred to as a bank or a partition) 1114 is formed so as to cover ends of the first electrode (anode) 1113. The insulator 1114 is required to be formed of an organic resin film or an insulating film including silicon. Here, a positive type photosensitive aclyric resin film is used to form the insulator 1114 having the shape as shown in FIG. 7B.

In order to obtain a favorable coverage, top ends or bottom ends of the insulator 1114 are formed to have a curved surface. For example, in the case of using positive type photosensitive aclyric as a material for the insulator 1114, only the top ends of the insulator 1114 are required to have a curved surface having a curvature radius of 0.2 μm to 3 μm. Alternatively, negative type photosensitive organic resin which becomes insoluble in etchant according to light or positive type organic resin which becomes soluble in etchant according to light can be used as the insulator 1114.

The insulator 1114 may be covered with a protective film formed of an aluminum nitride film, an aluminum oxynitride film, a thin film including carbon as a main component, or a silicon nitride film.

Over the first electrode (anode) 1113, an organic compound layer 1115 is selectively deposited by vapor deposition. Then, a second electrode (cathode) 1116 is formed over the organic compound layer 1115. As the cathode 1116, a material having a low work function (Al, Ag, Li, Ca, or an alloy of them such as MgAg, MgIn, AlLi, $CaF_2$ or CaN) is required to be used. Here, the second electrode (cathode) 1116 is formed so as to transmit light by laminating a metal thin film (MgAg) having a thickness of 10 nm, a transparent conductive film (ITO) having a thickness of 110 nm, and $In_2O_3$—ZnO, ZnO, and the like. In this manner, a light emitting element 1118 including the first electrode (anode) 1113, the organic compound layer 1115, and the second electrode (cathode) 1116 is formed.

By forming patterns selectively after selecting a material appropriately for the organic compound layer 1115 for obtaining emission of R, G, and B, a full color display can be achieved.

In addition, in order to prevent that a far side of a display panel of such dual emission display device is seen through, optical films 1140 and 1141 are provided as anti-reflection films against the outside light.

As the optical films 1140 and 1141, a polarizing film (highly light transmissive polarizer, thin polarizer, white polarizer, high-performance dye type polarizer, AR polarizer, and the like), a retardation film (wide band ¼ λ plate, temperature compensation retardation film, twisted retardation film, wide viewing angle retardation film, two axes-aligned retardation film, and the like), a luminance enhancing film, and the like are required to be combined appropriately. For example, when polarizing films are used as the optical films 1140 and 1141 so that their optical axes are crossed at right angles with each other, it can be prevented that the far side of the panel is seen through while preventing reflection. In this case, a portion other than the portion which displays an image by emitting light is in black, whereby the far side of the panel is seen through from neither side of the panel. In addition, since light emitted from the light emitting panel passes through only one polarizer, the light is displayed as it is.

Note that a similar effect as the above can be obtained even when the two polarizers are not disposed so as to have their optical axes crossed at right angles with each other, as long as the crossed axes angle is within ±45°, or more preferably within ±20°.

By using the optical films 1140 and 1141, it is prevented that the far side of the panel is seen through by a driver, which helps the displayed image to be recognized clearly.

One of the optical films 1140 and 1141 is made removable, thereby switching between a transmission mode and a non-transmission mode.

Further more, one more optical film may be provided. For example, it is possible to make an S wave (or a P wave), which is absorbed in one of the polarizing films, reflected to the side of the light emitting element, and to provide a luminance enhancing film for reprocessing the wave between the polarizer and the light emitting panel. As a result, the amount of the P wave (or S wave) which passes through the polarizer is increased, and the total amount of light is increased accordingly. A dual emission panel has different layer structures in each of the top side and the bottom side of the panel through which light from a light emitting element passes through, and thus the light emission (luminance, color tone, and the like) differs in each side. Thus, optical films can be effectively used for controlling a balance of the emission in each side. In addition, reflectance of the outside light also differs in each side of the dual emission display panel, therefore, it is preferable that a luminance enhancing film is provided between the polarizer and the light emitting panel on the side having more reflection.

A transparent protective layer 1117 is formed so as to seal the light emitting element 1118. The transparent protective layer 1117 includes a lamination of a first inorganic insulating film, a stress relaxation film, and a second inorganic insulating film. The first or the second inorganic insulating film can be formed of a nitride silicon film, an oxide silicon film, an oxynitride silicon film (SiNO film (composition ratio of N>O) or SiOn film (composition ratio of N<O)), or a thin film including carbon as a main component (for example, a DLC film or a CN film). These inorganic insulating films have high blocking effect against moisture, however, they are likely to be pealed off when formed thick since a film stress is increased correspondingly. However, by providing the stress relaxation film between the first and second inorganic insulating films, the stress can be relaxed while absorbing moisture. Further, even when a minute hole (pin hole) is formed in the first inorganic insulating film during the deposition for some reason, the hole can be filled with the stress relaxation film. Then, by providing the second inorganic insulating film over the stress relaxation film, a high blocking effect against moisture and oxygen can be obtained. As for the stress relaxation film, a material having hygroscopic property and having less stress than the inorganic insulating films is preferably used. It is even desirable that the material transmits light. As the stress relaxation film, a material film including an organic compound such as 4,4'-bis [N-(1-naphthyl)-N-phenyl-amino]-biphenyl, BCP (bathocuproine), MTDATA (4,4',4"-tris [N-(3-methylphenyl)-N-phenyl-amino]-triphenylamine), and Alq$_3$ (tris (8-quinolinolato) aluminum complex) can be used. These material films have hydroscopic property and are almost transparent when formed thin. Alternatively, the stress relaxation film can be formed by MgO, SrO$_2$, or SrO as they have hydroscopic property and light transmissivity, and can obtain a thin film by vapor deposition. In this embodiment, a film which is deposited in an atmosphere including nitrogen and argon by using a silicon target, namely a nitride silicon film having a high blocking effect against impurities such as moisture and alkaline metal is used as the first or the second inorganic insulating film, and a thin film of Alq$_3$ formed by vapor deposition is used as the stress relaxation film. Furthermore, since light is emitted through the transparent protective layer 1118, the total film thickness thereof is preferably as small as possible.

In order to seal the light emitting element 1118, the sealing substrate 1104 is attached with the first sealing material 1105 and the second sealing material 1107 in an inert gas atmosphere. The first sealing material 1105 is preferably formed of epoxy resin, while the second sealing material 1107 can be formed by using any material as long as it can transmit light. Typically, an ultraviolet curable or heat curable epoxy resin is preferably used. Here, highly heat-resistant UV epoxy resin (manufactured by ELECTRO-LITE CORPORATION: 2500 Clear) is used, which has a refraction factor of 1.50, viscosity of 500 cps, hardness of 90 D, tensil strength of 3000 psi, glass transition temperature of 150° C., volume resistance of $1 \times 10^{15}$ ohm/cm, and dielectric strength of 450 V/mil. In addition, by filling the second sealing material 1107 between the pair of substrates, light transmissivity as a whole can be enhanced as compared to the case of filling air (inert gas atmosphere) between them. It is preferable that each of the first sealing material 1105 and the second sealing material 1107 is formed of a material which hardly transmits moisture and oxygen as possible.

As for a material for forming the sealing substrate 1104 in this embodiment, a plastic substrate formed of an FRP (Fiberglass-Reinforced Plastic), PVF (Polyvinylfluoride), mylar, polyester, acrylic, or the like may be used as well as a glass substrate and a quartz substrate. Further, after attaching the sealing substrate 1104 with the first sealing material 1105 and the second sealing material 1107, a third sealing material can be additionally provided so as to cover the side faces (exposed faces).

By sealing the light emitting element with the first sealing material 1105 and the second sealing material 1107 as described above, the light emitting element can be completely shielded from the outside, thereby blocking out moisture and oxygen which promote the deterioration of the organic compound layer. Accordingly, highly reliable light emitting device can be provided.

This embodiment can be freely implemented with embodiment mode, Embodiment 1, or Embodiment 2.

EMBODIMENT 4

Figure 8A:
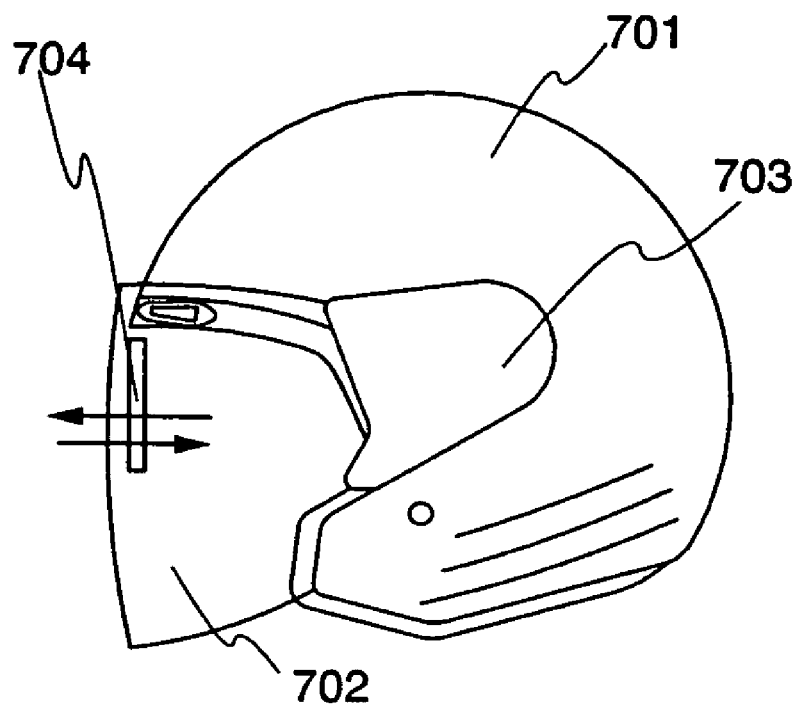
FIGS. 8A and 8B are views of the light emitting device of the invention which is installed in a helmet.
Figure 8B:
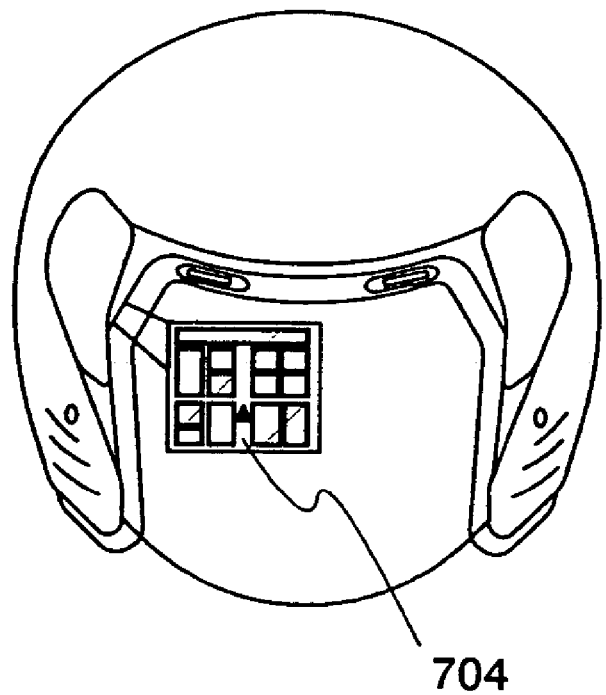

In this embodiment, FIGS. 8A and 8B show helmets each installed a light emitting device. In the case of a vehicle having small frontspace around a driver's seat such as a motorcycle and a snowmobile, a light emitting device is installed in a helmet. The light emitting device can display with high resolution such as map data and is advantageous in its lightweight and compactness compared with the other display devices. The projection display device requires a light path for projection, which is difficult to provide in a limited space inside vehicle even when a mirror and the like are used.

FIG. 8A is a side view of a helmet to which a light emitting display device 704 is mounted. FIG. 8B is a side view of the helmet. In FIGS. 8A and 8B, reference numeral 701 denotes a helmet body, 702 denotes a shield, 703 denotes a part for attaching the shield.

Figure 4B:
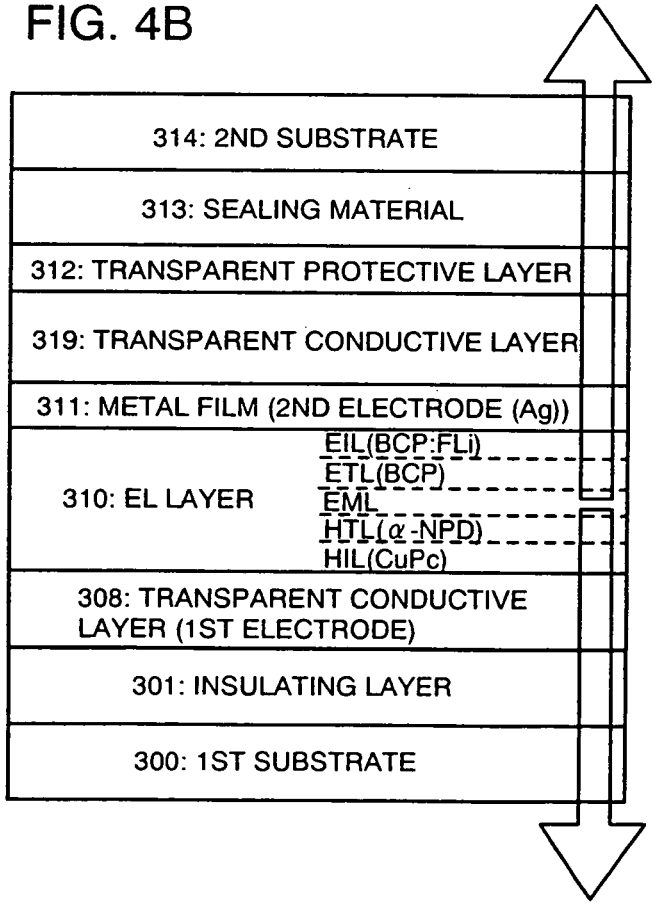

The light emitting display device 704 mounted on the helmet is structured so that a far side of the display can be seen, and that is a structure of a light emitting element shown in FIGS. 4A and 4B. The display can be switched as shown in FIGS. 1A and 1B. In the case of switching between a transmission mode display and a non-transmission mode display, a polarizer (not shown) is preferably adjusted in slide manner or manually.

The light emitting display device 704 which can display namely a far side of the display is mounted on a helmet, realizing a display within the forward sight of a person who wears the helmet, so that he can view displayed data safely while keeping his eyes ahead at the wheel. According to the light emitting display device 704, in addition, an engine trouble, a warning for fuel shortage, and the like can be displayed within the forward sight of a person who wears the helmet, so that safety is obtained because he can catch the machine trouble instantaneously.

The system is constructed so as to receive a location signal such as latitude and longitude data from a satellite by using a GPS, measures the present location based on either or both of a detected signal and the location signal, read out map data from the memory device based on the result of measurement, and finally the present location is displayed by the light emitting display device 704, though not shown. Furthermore, the light emitting display device 704 is connectable to a battery, an antenna, a display control portion, a vehicle body, or a CPU (connection with an electric cord or with infrared data communication). Accordingly, the light emitting display device 704 can display not only map data but also a display for a measuring gauge of a vehicle and a character. In the case of a motorcycle, specifically, a display may be disturbed in many cases due to the water drop on a display portion of the measuring gauge or on the shield of the helmet when it rains, and besides in the night, it is further disturbed. The light emitting display device 704 of this embodiment disposed between the shield and eyes realizes a clear display even when it rains.

This embodiment can be implemented with Embodiment 2. For example, a driving support system as shown in FIGS. 5A and 5B or FIG. 6 may be constructed. In that case, a living body information signal is detected by a brain wave sensor attached to a temple portion inside the helmet. In the case of giving a warning, the light emitting display device 704 performs a warning display or flash light emission while a speaker or an earphone outputs an alarm sound.

A case of preventing a driver of a motorcycle from falling asleep is described below in detail.

When the motorcycle driver is normal, the light emitting display device 704 mounted on the helmet can display a far side of the display, so that he can view displayed data safely while keeping his eyes ahead at the wheel. In that case, a pattern of a trajectory graphic of a chaos attractor is constructed in a complex shape after the calculation of the chaos attractor by numerically processed data from the brain wave sensor by a CPU and the like. Therefore, a driving support system does not give any warning.

When the motorcycle driver starts sleeping, the pattern of the trajectory graphic of the chaos attractor is constructed in a simple shape after the calculation of the chaos attractor by numerically processed data from the brain wave sensor by the CPU and the like. Therefore, the driving support system performs a warning display or a switching of a display, or outputs an alarm sound.

Note that the helmet shown in FIGS. 8A and 8B may be used for an amusement instrument for a flight simulation game and the like requiring a helmet as well as for vehicles including the motorcycle.

This embodiment can be freely implemented with Embodiment 2.

According to the driving support system of the invention, change in driver's mental and physical conditions can be caught instantaneously and a warning is given by changing a display and flash light emission to call the driver's attention.

Further, The light emitting device of the invention is thin, lightweight, and consumes low power. Since the light emitting device of the invention is transparent or translucent, a visual image superposed on a front scene can be displayed, so that safe driving is realized.

This application is based on Japanese Patent Application serial no. 2003-299126 filed in Japan Patent Office on 22th, Aug., 2003, the contents of which are hereby incorporated by reference.

Although the invention has been fully described by way of Embodiment Modes and with reference to the accompanying drawings, it is to be understood that various changes and modifications will be apparent to those skilled in the art. Therefore, unless such changes and modifications depart from the scope of the invention hereinafter defined, they should be constructed as being included therein.

What is claimed is:

1. A driving support system comprising:
   a camera for shooting a forward scene or a peripheral scene outside a vehicle;
   a means for detecting a living body information of a driver;
   a judging means for judging if there is any vehicle ahead, an obstruction, or the living body information of the driver; and
   a light emitting device for displaying data on a drive of the vehicle or a warning data based on the judging means, the light emitting device comprising a first polarizer on a first surface of the light emitting device and a second polarizer, which is removable, near a second surface of the light emitting device,
   wherein the light emitting device switches between a display superposed with the forward scene outside the vehicle in case of displaying data on the drive of the vehicle and a display without the forward scene outside the vehicle, which is shielded using the second polarizer, in case of displaying the warning data.

2. A driving support system according to claim 1, further comprising an audio output means for outputting the warning data based on the judging means.

3. A driving support system according to claim 1, further comprising a location data calculating means for calculating a self-location based on a signal from a GPS receiver and a memory means for storing map data, and the map data is read out from the memory means based on the location data calculating means and outputted by the light emitting device.

4. A driving support system according to claim 1, wherein the forward scene outside the vehicle can be viewed through a non-emitting part of the light emitting device when non-emitting, and by moving the second polarizer on the second surface of the light emitting device, the display without the forward scene outside the vehicle is obtained.

5. A driving support system according to claim 1, wherein the judging means for judging living body information of the driver is a means for judging driver's mental and physical conditions comprising a sensor for catching living body information of the driver, a chaos attractor generating portion for calculating a chaos attractor by numerically processed data caught by the sensor, and a lyapunov index generating portion for calculating an index indicating to what degree the chaos attractor matches a definition of the chaos.

6. A driving support system comprising:
   a camera for shooting a forward scene or a peripheral scene outside a vehicle;
   a means for detecting a living body information of a driver;
   a judging means for judging if there is any vehicle ahead, an obstruction, or the living body information of the driver;
   a light emitting device for displaying data on a drive of the vehicle or a warning data based on the judging means, the light emitting device comprising a first polarizer on a first surface of the light emitting device and a second polarizer, which is removable, near a second surface of the light emitting device; and
   a surrounding circumstance detecting means for detecting a surrounding circumstance of a vehicle,
   wherein a display superposed with the forward scene outside the vehicle in a transmission mode and a display without the forward scene outside the vehicle in a non-transmission mode are switched automatically using the second polarizer depending on a surrounding circumstance obtained by the surrounding circumstance detecting means.

7. A driving support system according to claim 6, wherein the surrounding circumstance detecting means is a sensor for detecting the light intensity in the vehicle.

8. A driving support system according to claim 6, further comprising an audio output means for outputting the warning data based on the judging means.

9. A driving support system according to claim 6, further comprising a location data calculating means for calculating a self-location based on a signal from a GPS receiver and a memory means for storing map data, and the map data is read out from the memory means based on the location data calculating means and outputted by the light emitting device.

10. A driving support system according to claim 6, wherein the forward scene outside the vehicle can be viewed through a non-emitting part of the light emitting device when non-emitting, and moving the second polarizer on the second surface of the light emitting device, the display without the forward scene outside the vehicle is obtained.

11. A driving support system according to claim 6, wherein the judging means for judging living body information of the driver is a means for judging driver'mental and physical conditions comprising a sensor for catching living body information of the driver, a chaos attractor generating portion for calculating a chaos attractor by numerically processed data caught by the sensor, and a lyapunov index generating portion for calculating an index indicating to what degree the chaos attractor matches a definition of the chaos.

12. A driving support system comprising:

a camera for shooting a forward scene or a peripheral scene outside a vehicle;

a means for detecting a living body information of a driver;

a judging means for judging if there is any vehicle ahead, an obstruction, or the living body information of the driver;

a light emitting device for displaying data on a drive of the vehicle or a warning data based on the judging means, the light emitting device comprising a first polarizer on a first surface of the light emitting device and a second polarizer, which is removable, near a second surface of the light emitting device; and a surrounding circumstance detecting means for detecting a surrounding circumstance of a vehicle, wherein the light emitting device displays data on the drive of the vehicle superposed with the forward scene outside the vehicle, and wherein the light emitting device emitting device emits a flash light from the whole surface instantaneously to the driver and to a forward sight of the driver for displaying a warning.

13. A driving support system according to claim 12, further comprising an audio output means for outputting the warning data based on the judging means.

14. A driving support system according to claim 12, further comprising a location data calculating means for calculating a self-location based on a signal from a GPS receiver and a memory means for storing map data, and the map data is read out from the memory means based on the location data calculating means and outputted by the display means.

15. A driving support system according to claim 12, wherein the display means is a light emitting device by which the forward scene outside the vehicle can be viewed through a non-emitting part of the light emitting device when non-emitting, and by moving the second polarizer on the second surface of the light emitting device, the display without the forward scene outside the vehicle which is obtained.

16. A driving support system according to claim 12, wherein the judging means for judging living body information of the driver is a means for judging driver's mental and physical conditions comprising a sensor for catching living body information of the driver, a chaos attractor generating portion for calculating a chaos attractor by numerically processed data caught by the sensor, and a lyapunov index generating portion for calculating an index indicating to what degree the chaos attractor matches a definition of the chaos.

* * * * *

UNITED STATES PATENT AND TRADEMARK OFFICE
CERTIFICATE OF CORRECTION

PATENT NO. : 7,598,927 B2 Page 1 of 1
APPLICATION NO. : 10/918402
DATED : October 6, 2009
INVENTOR(S) : Yamazaki et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 916 days.

Signed and Sealed this

Fourteenth Day of December, 2010

David J. Kappos
*Director of the United States Patent and Trademark Office*